US009952479B2

United States Patent
Cao et al.

(10) Patent No.: US 9,952,479 B2
(45) Date of Patent: Apr. 24, 2018

(54) DISPLAY SUBSTRATE AND METHOD FOR FABRICATING THE SAME, DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Binbin Cao, Beijing (CN); Peng Jiang, Beijing (CN); Peng Chen, Beijing (CN); Jongwon Moon, Beijing (CN); Yinhu Huang, Beijing (CN); Chengshao Yang, Beijing (CN); Haipeng Yang, Beijing (CN)

(73) Assignees: BOE TECHNOLOGY GROUP CO., LTD., Beijing (CN); HEFEI XINSHENG OPTOELECTRONICS TECHNOLOGY, CO., LTD., Hefei, Anhui (CN)

( * ) Notice: Subject to any disclaimer, the term of this patent is extended or adjusted under 35 U.S.C. 154(b) by 84 days.

(21) Appl. No.: 15/108,114

(22) PCT Filed: Jan. 6, 2016

(86) PCT No.: PCT/CN2016/070223
§ 371 (c)(1),
(2) Date: Jun. 24, 2016

(87) PCT Pub. No.: WO2016/169305
PCT Pub. Date: Oct. 27, 2016

(65) Prior Publication Data
US 2017/0139297 A1  May 18, 2017

(30) Foreign Application Priority Data

Apr. 24, 2015 (CN) .......................... 2015 1 0205166

(51) Int. Cl.
G02F 1/1362 (2006.01)
G02F 1/1343 (2006.01)
G02F 1/1368 (2006.01)

(52) U.S. Cl.
CPC ...... *G02F 1/136286* (2013.01); *G02F 1/1368* (2013.01); *G02F 1/13439* (2013.01);
(Continued)

(58) Field of Classification Search
CPC . H01L 27/124; H01L 27/322; H01L 27/3241; H01L 27/3248; H01L 31/02162;
(Continued)

(56) References Cited

U.S. PATENT DOCUMENTS 6,781,162 B2 * 8/2004 Yamazaki ............. H01L 27/322
257/184
7,839,083 B2 * 11/2010 Kubota ............... H01L 27/3258
313/505

(Continued)

FOREIGN PATENT DOCUMENTS

CN 1434668 A 8/2003
CN 1609689 A 4/2005

(Continued)

OTHER PUBLICATIONS

International Search Report dated Apr. 8, 2016 issued in corresponding International Application No. PCT/CN2016/070223 along with an English translation of the International Searching Authority.

(Continued)

*Primary Examiner* — Mohsen Ahmadi
(74) *Attorney, Agent, or Firm* — Nath, Goldberg & Meyer; Joshua B. Goldberg

(57) ABSTRACT

The present invention relates to a display substrate and a method for fabricating the same, a display panel and a display device. The display substrate comprises a plurality
(Continued)

of pixels, each of which has a display region, a non-display region being between the plurality of pixels, and the display substrate further comprises a protection metal layer covering the non-display region. In the display substrate, the protection metal layer covers the non-display region of the display substrate so as to shield the structures of the thin-film transistors, signal lines and the like on the display substrate, and thus the stability of structure of the display panel as well as the high resolution of the display panel and excellent display effect thereof can be ensured, and, in the meantime, the procedure of fabrication process is simplified, the manufacture efficiency is improved, and the cost for manufacturing is reduced.

13 Claims, 6 Drawing Sheets

(52) U.S. Cl.
CPC ................ *G02F 1/136209* (2013.01); *G02F 2001/13629* (2013.01); *G02F 2001/136218* (2013.01); *G02F 2001/136222* (2013.01); *G02F 2001/136295* (2013.01); *G02F 2201/121* (2013.01); *G02F 2202/16* (2013.01)

(58) Field of Classification Search
CPC ......... G02F 1/133514; G02F 1/136209; G02F 2001/136218; G02F 2001/136222
See application file for complete search history.

(56) References Cited

U.S. PATENT DOCUMENTS

| | | | |
|---|---|---|---|
| 9,454,073 B2* | 9/2016 | Ha | G03F 1/38 |
| 2013/0027646 A1 | 1/2013 | Cho et al. | |
| 2013/0088672 A1* | 4/2013 | Shin | G02F 1/133512 |
| | | | 349/110 |
| 2015/0253899 A1 | 9/2015 | Yang et al. | |
| 2017/0005119 A1* | 1/2017 | Kang | G02F 1/13394 |

FOREIGN PATENT DOCUMENTS

| | | |
|---|---|---|
| CN | 102902118 A | 1/2013 |
| CN | 103412697 A | 11/2013 |
| CN | 103956335 A | 7/2014 |
| CN | 104752444 A | 7/2015 |

OTHER PUBLICATIONS

First Office Action dated Apr. 10, 2017 in corresponding Chinese Application No. 201510205166.1.

* cited by examiner

DISPLAY SUBSTRATE AND METHOD FOR FABRICATING THE SAME, DISPLAY PANEL AND DISPLAY DEVICE

This is a National Phase Application filed under 35 U.S.C. 371 as a national stage of PCT/CN2016/070223, filed Jan. 6, 2016, an application claiming the benefit of Chinese Application No. 201510205166.1, filed Apr. 24, 2015, the content of each of which is hereby incorporated by reference in its entirety.

FIELD OF THE INVENTION

The present invention relates to the field of display technology, and specifically relates to a display substrate and a method for fabricating the same, a display panel and a display device.

BACKGROUND OF THE INVENTION

A thin-film-transistor liquid crystal display (hereinafter referred to as TFT LCD) includes a first substrate and a second substrate arranged opposite with and aligned to each other, and a liquid crystal layer interposed between the first substrate and the second substrate.

In an existing TFT LCD, thin-film transistors are provided on the first substrate, which are used as driving switches. Color filters and a black matrix are provided on the second substrate, the color filters being used to implement a color display, the black matrix being used to shield the thin-film transistors and signal lines. In such a TFT LCD, it is inevitable that the first substrate and the second substrate are arranged opposite with and aligned to each other with an arrangement deviation, and thus the black matrix is required to have a relatively large width, so as to be capable of shielding the thin-film transistors and signal lines with the occurrence of the arrangement deviation. However, an aperture ratio would be reduced due to the black matrix having a relatively large width, thereby affecting the brightness as well as the image quality of a display panel.

In another existing TFT LCD, the thin-film transistors, the color filters and the black matrix are provided on one substrate, i.e., a technique of color filter on Array (COA), and FIG. 1 illustrates a structure of a display panel of such a TFT LCD. Specifically, the display panel of the TFT LCD includes a first substrate 1, a second substrate 2 and a liquid crystal layer 3, wherein a spacer 4 is disposed between the first substrate 1 and the second substrate 2 to maintain a distance between the first substrate 1 and the second substrate 2, i.e., a thickness of the liquid crystal layer 3. A thin-film transistor 10, a first insulation layer 11, a black matrix 12, a color filter 13, a planarization layer 14, a pixel electrode 15, a second insulation layer 16 and a common electrode 17 are disposed on the first substrate 1, in which the thin-film transistor 10 includes a gate electrode 100, a gate insulation layer 101, an active layer 102, a source electrode 103 and a drain electrode 104. The first insulation layer 11 and the second insulation layer 16 are generally made of silicon nitride (SiNx).

In such a TFT LCD, the thin-film transistor 10, the color filter 13 and the black matrix 12 are provided on the first substrate 1, so as to avoid influencing on the shielding effect of the black matrix 12 on the thin-film transistor 10 and the signal lines due to the arrangement deviation between the first substrate and the second substrate, and thus there is no need to provide the black matrix 12 with a relatively large width. Accordingly, compared with the previous TFT LCD, the aperture ratio of the display panel may be increased by using the TFT LCD, thereby improving the brightness and the image quality of the display panel.

However, in the above TFT LCD employing the COA technique, it is difficult to form a pattern of the black matrix 12 on the first insulation 11, and such problem has emerged that, the material of the black matrix 12 in the prior art cannot meet the requirement of a high resolution for the display panel; the material of the black matrix 12 has an insufficient adhesion capability to the material of the first insulation layer 11 (e.g., SiNx or the like), resulting in an unstable structure of the display panel; and, after the development step of the lithography process for forming the pattern of the black matrix 12, a residue of the material of black matrix easily remains on a surface of the first insulation layer 11, resulting in display defects.

SUMMARY OF THE INVENTION

There is provided a display substrate comprising a plurality of pixels, in which each pixel has a display region while a non-display region is between the plurality of pixels. The display substrate further comprises a protection metal layer covering the non-display region.

Optionally, the protection metal layer has a reflectivity no more than 20%.

Optionally, the protection metal layer is made of at least one of MoNbO, MoNbON, MoTiO, MoTiON and MoSi.

Optionally, the display substrate further comprises a common electrode which electrically contacts the protection metal layer.

Optionally, the common electrode is made of at least one of ITO, ITZO, IGZO and IZO.

Optionally, the protection metal layer includes at least one layer, and the layer of the protection metal layer electrically contacting the common electrode has a resistivity less than that of the common electrode.

Optionally, the display substrate further comprises a base substrate, a thin-film transistor, a color filter and a pixel electrode.

Optionally, the display substrate further comprises a first insulation layer, a second insulation layer and a planarization layer, wherein the thin-film transistor is disposed on the base substrate and the first insulation layer is disposed above the thin-film transistor; the color filter is disposed above the first insulation layer and the planarization layer is disposed above the color filter; the pixel electrode is disposed above the planarization layer and the second insulation layer is disposed above the pixel electrode; and the protection metal layer is disposed above the second insulation layer and under the common electrode.

The present invention also provides a method for fabricating the above display substrate provided by the present invention, the method comprising a step of forming the protection metal layer in the non-display region of the display substrate.

Optionally, the protection metal layer is fabricated by a lithography process.

Optionally, the method for fabricating the display substrate further comprises the following steps of:
  forming the thin-film transistor on the base substrate;
  forming the first insulation layer above the thin-film transistor;
  forming the color filter above the first insulation layer;
  forming the planarization layer above the color filter;
  forming the pixel electrode above the planarization layer;

forming the second insulation layer above the pixel electrode; and forming the common electrode above the protection metal layer and the second insulation layer, wherein the protection metal layer is formed above a portion of the second insulation layer.

As yet another technical solution, the present invention also provides a display panel including the above display substrate provided by the present invention.

As still another technical solution, the present invention also provides a display device including the above display panel provided by the present invention.

The beneficial effects of the present invention are as follows.

In the display substrate provided by the present invention, the protection metal layer covers the non-display region of the display substrate so as to shield the structures of the thin-film transistor, signal lines and the like of the display substrate. Compared to the existing technology having the black matrix, the stability of structure of the display panel, as well as the high resolution of the display panel and excellent display effect thereof, can be ensured by the display substrate having the protection metal layer, and, in the meantime, the procedure of fabrication process is simplified, the manufacture efficiency is improved, and the cost for manufacturing is reduced.

In the method for fabricating a display substrate provided by the present invention, the protection metal layer is formed on the non-display region of the display substrate so as to shield the structures of the thin-film transistor, signal lines and the like on the display substrate. As an alternative to the black matrix in the prior art, the stability of structure of the display panel, as well as the high resolution of the display panel and excellent display effect thereof, can be ensured by using the protection metal layer, and, in the meantime, the procedure of fabricating the display substrate is simplified, the manufacture efficiency is improved, and the cost for manufacturing is reduced.

In the display panel provided by the present invention, the above display substrate provided by the present invention is used and there is no need to fabricate the black matrix in the prior art, and thus the stability of structure of the display panel as well as the high resolution of the display panel and excellent display effect thereof can be ensured, and, in the meantime, the procedure of fabrication process is simplified, the manufacture efficiency is improved, and the cost for manufacturing is reduced.

In the display device provided by the present invention, the above display panel provided by the present invention is used and there is no need to fabricate the black matrix in the prior art, and thus the stability of structure of the display panel as well as the high resolution of the display panel and excellent display effect thereof can be ensured, and, in the meantime, the procedure of fabrication process is simplified, the manufacture efficiency is improved, and the cost for manufacturing is reduced.

BRIEF DESCRIPTION OF THE DRAWINGS

The accompanying drawings, which constitute a part of the specification, are provided for further understanding of the present invention, and for explaining the present invention together with the following specific embodiments, but not intended to limit the present invention. In the drawings.

Figure 1:
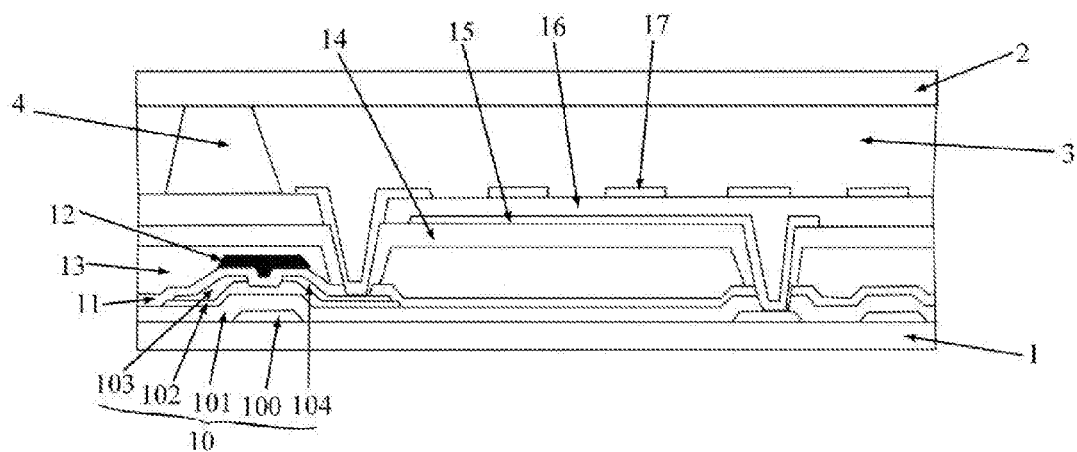
FIG. 1 is a diagram of a conventional display panel with the COA technique.

REFERENCE NUMERALS 1. first substrate/display panel; 2. second substrate/alignment substrate; 3. liquid crystal layer; 4. spacer; 10. thin-film transistor; 11. first insulation layer; 12. black matrix; 13. color filter; 14. planarization layer; 15. pixel electrode; 16. second insulation layer; 17. common electrode; 18. protection metal layer; 100. gate electrode; 101. gate insulation layer; 102. active layer; 103. source electrode; 104. drain electrode; 180. first layer structure of the protection layer; 181. second layer structure of the protection layer.

DETAILED DESCRIPTION OF THE EMBODIMENTS

Specific embodiments of the present invention will be described below in detail in conjunction with the accompanying drawings. It should be understood that the embodiments to be described is only intended to illustrate and explain the present invention, but not to limit the present invention.

Figure 2:
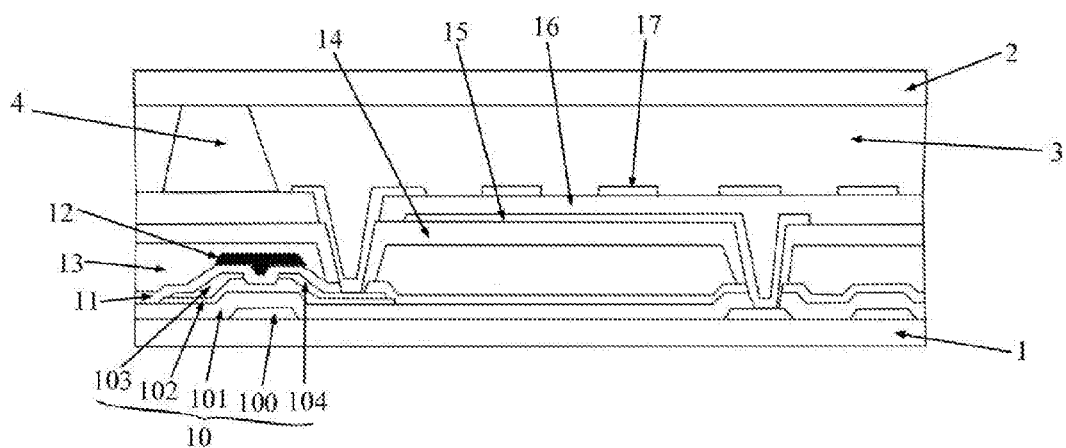
FIG. 2 is a diagram of a display substrate provided by an embodiment of the present invention.

The present invention provides an embodiment of the display substrate, and FIG. 2 is a diagram of the display substrate provided by an embodiment of the present invention. As shown in FIG. 2, in the present embodiment, the display substrate 1 comprises a plurality of pixels, wherein each pixel has a display region 'a' and a non-display region is between the display regions 'a' of the plurality of pixels. The display substrate 1 further comprises a protection metal layer 18 covering the non-display region.

Specifically, the display region 'a' of each pixel is generally a region in which a pixel electrode of the pixel is positioned, and the non-display region is generally a region in which thin-film transistors and signal lines are arranged. However, in some cases, the non-display region may also include an edge area of the pixel electrode. As described above, in the prior art, the thin-film transistors and signal lines are generally shielded by arranging a black matrix within the non-display region.

It can be understood that the protection metal layer 18 may be made of a metal opaque to light. In the present embodiment, the protection metal layer 18 is disposed in the non-display region and covers the same, such that the protection metal layer 18 is capable of shielding the thin-film transistors, the signal lines and the like. That is, the protection metal layer 18 may take place of the black matrix in the prior art, and thus the procedure of fabrication process is simplified, the manufacture efficiency is improved, and the cost for manufacturing is reduced In the meantime, the present invention can avoid the following problem in the prior art that, the material of the black matrix cannot meet the requirement of a high resolution for the display panel; the material of the black matrix has an insufficient adhesion capability to the material of the first insulation layer, and a residue of the material of black matrix easily remains on a surface of the first insulation layer 11 after the development step, thereby reducing difficulties in the process for fabricating a display substrate.

Preferably, the protection metal layer 18 is made of a metal having low reflectivity, thereby reducing the reflection amount of the ambient light irradiating onto the protection metal layer 18, and reducing the impact on display effect by the reflection on the protection metal layer 18. Specifically, it is preferable that the reflectivity of the protection metal layer is no more than 20%.

Further, the protection metal layer 18 may be made of at least one of the following metals or metal alloys having low reflectivity: MoNbO, MoNbON, MoTiO, MoTiON and MoSi, such that the protection metal layer 18 has low reflectivity, thereby ensuring display effect.

Figure 3:
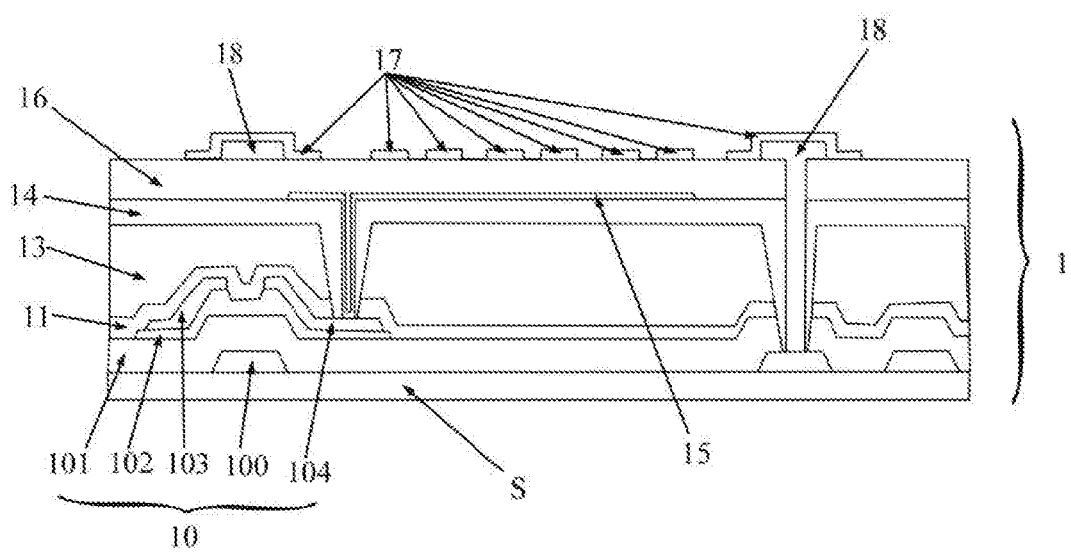
FIG. 3 is a cross-sectional view of the display substrate in FIG. 2 taken along A-A line.

As shown in FIG. 3, the display substrate 1 includes a thin-film transistor 10, a color filter 13, a pixel electrode 15 and a common electrode 17, wherein the thin-film transistor 10 is disposed on the base substrate S and a first insulation layer 11 is disposed above the thin-film transistor 10; the color filter 13 is disposed above the first insulation layer 11 and a planarization layer 14 is disposed above the color filter 13; the pixel electrode 15 is disposed above the planarization layer 14 and a second insulation layer is disposed above the pixel electrode 15; and the protection metal layer 18 is disposed above the second insulation layer 16 and a common electrode 17 is disposed above the protection metal layer 18.

Optionally, the thin-film transistor 10 includes a gate electrode 100, a gate insulation layer 101, an active layer 102, a source electrode 103 and a drain electrode 104. As shown in FIG. 3, the gate electrode 100 is directly provided on the base substrate S, the gate insulation layer 101 is disposed above the gate electrode 100, the active layer 102 is disposed on the gate insulation layer 101, and the source electrode 103 and the drain electrode 104 are provided on the active layer 102.

It needs to be explained that, in the present embodiment, the arrangement of the gate electrode 100, the gate insulation layer 101, the active layer 102, the source electrode 103 and the drain electrode 104 of the thin-film transistor 10 are not limited to be arranged in a specific manner as shown in FIG. 3, and thin-film transistor may also have any other structure that can function to a thin-film transistor, such as a top-gate structure (i.e., in which the gate electrode 100 is above the active layer 102). Similarly, in the present embodiment, structures of the thin-film transistor 10, the color filter 13, the pixel electrode 15, the common electrode 17 and the protection metal layer 18 are not limited to the structures as shown in FIG. 3, and they can have any other structure that is capable of achieving a function of display and has the protection metal layer 18 covering the non-display region.

Preferably, as shown in FIG. 3, the protection metal layer 18 electrically contacts the common electrode 17, and resistivity of the protection metal layer 18 is less than that of the common electrode 17. By means of such an arrangement, a signal transmitted through the common electrode 17 is jointly transmitted through the protection metal layer 18 and the common electrode 17 electrically contacting with each other, resulting in a reduced resistance of the common electrode for signal transmission, which is thereby helpful to maintain consistency of the signal transmitted through the common electrode line and improve display effect.

In the present embodiment, the common electrode 17 may be made of at least one of ITO, ITZO, IGZO and IZO. In this case, the protection metal layer 18 may be made of a metal having less resistivity than the above ITO, ITZO, IGZO and IZO, such as copper, iron, silver, gold or the like.

In addition, in a case where the protection metal layer 18 is made of a metal alloy with low reflectivity, such as MoNbO, MoNbON, MoTiO, MoTiON, MoSi or the like, resistivity of the metal alloy may be less than that of ITO, ITZO, IGZO and IZO when such metal alloy is doped with small amount of O, N or the like. As such, when the protection metal layer 18 is made of a low-reflectivity material doped with small amount of O or N as described above, the resistance of the common electrode for signal transmission may be reduced by virtue of the structure in which the protection metal layer 18 and the common electrode 17 electrically contact with each other as shown in FIG. 3, which is thereby helpful to maintain consistency of the signal transmitted through the common electrode line and improve display effect.

Figure 4:
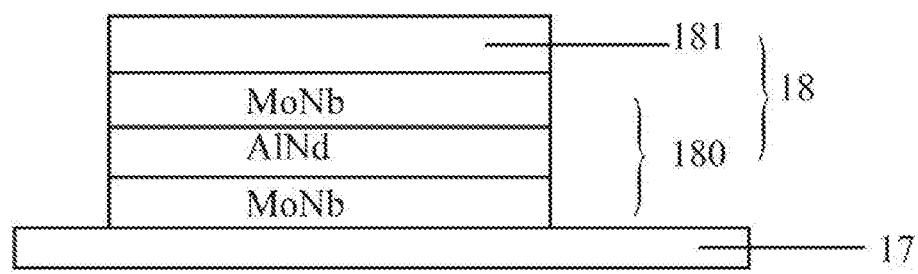
FIG. 4 is a diagram of another structure of the protection metal layer according to an embodiment of the present invention.

When the doping amount of O, N or the like is relatively large in the above metal alloy with low reflectivity such as MoNbO, MoNbON, MoTiO, MoTiON, MoSi or the like, resistivity of the metal alloy is relatively high. It can be understood that, in a case where the protection metal layer 18 is only made of the above low-reflectivity material, it is unable to effectively reduce the resistance of the common electrode for signal transmission by electrically contacting the protection metal layer 18 with the common electrode 17. In this case, the protection metal layer 18 and the common electrode 17 may be provided with a structure as shown in FIG. 4. As shown in FIG. 4, the protection metal layer 18 may include a multilayer structure, that is, may include a first layer structure 180 at the bottom and a second layer structure 181 above the first layer structure 180, wherein the first layer structure 180 has low resistivity. Specifically, the first layer structure 180 may include a layer of MoNb, a layer of AlNd and a layer of MoNb sequentially disposed, as shown in FIG. 4, and the second layer structure 181 is made of a low-reflectivity metal alloy, such as the above MoNbO, MoNbON, MoTiO, MoTiON, MoSi or the like in which the doping amount of O, N or the like is relatively large. Such the protection metal layer 18 is positioned on the common electrode 17, and thus a portion of the protection metal layer 18 which electrically contacts the common electrode 17 has low resistivity, resulting in a reduced resistance of the common electrode for signal transmission, which is thereby helpful to maintain consistency of the signal transmitted through the common electrode line and improve display effect. In addition, the second layer structure 181 at the upper part has low reflectivity, which results in a relatively weak reflection when light irradiates on the protection metal layer 18, and thus avoids impacting on display effect. It needs to be noted that the first layer structure 180 is not limited to the multilayer structure as shown in FIG. 4, and may have a monolayer structure formed of a metal with low resistivity, such as Cu, Al, Mo, Ag or the like, thereby reducing the thickness of the protection metal layer 18 and facilitating to the manufacture of a thinner and lighter display substrate.

According to the display substrate provided by the embodiment of the present invention, the protection metal layer 18 of the display substrate covers the non-display region of the display substrate so as to shield the structures of the thin-film transistors, signal lines and the like on the display substrate, and thus the stability of structure of the display panel as well as the high resolution of the display panel and excellent display effect thereof can be ensured, and, in the meantime, the procedure of fabrication process is simplified, the manufacture efficiency is improved, and the cost for manufacturing is reduced.

The present invention also provides an embodiment of a method for fabricating the display substrate provided by the above embodiment. Specifically, the method for fabricating the display substrate includes a step of forming the protection metal layer in the non-display region of the display substrate.

After the step of forming the protection metal layer in the non-display region of the display substrate, the protection metal layer would shield the structures of the thin-film transistors, the signal lines and the like on the display substrate to avoid their adverse influence on display function, thereby ensuring excellent display effect. Also, since the protection metal layer shield the structures of the thin-film transistors, the signal lines and the like, there is no need to provide the black matrix during fabrication of display substrate, and thus the stability of structure of the display panel as well as the high resolution of the display panel and excellent display effect thereof can be ensured, and, in the meantime, the procedure of fabrication process is simplified, the manufacture efficiency is improved, and the cost for manufacturing is reduced.

Figure 5:
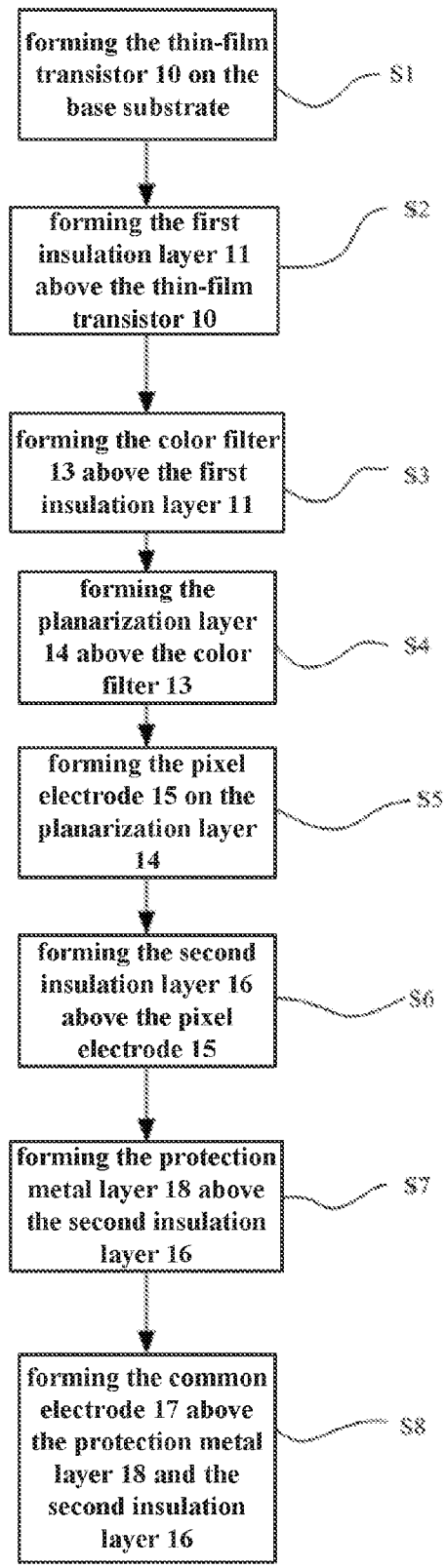
FIG. 5 is a flow chart of a method for fabricating the display substrate provided by the embodiment of the present invention.

FIG. 5 is a flow chart of a method for fabricating a display substrate, provided by the present embodiment. As shown in FIG. 5, the method for fabricating a display substrate may include the following steps S1 to S8.

Figure 6:
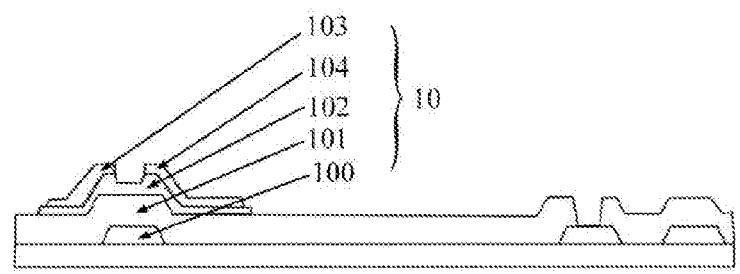
FIG. 6 is a diagram of the display substrate after completing the fabrication of the thin-film transistor.

In step S1, a thin-film transistor 10 is formed on a base substrate. The display substrate may have a structure as illustrated in FIG. 6 after the fabrication of the thin-film transistor 10 is completed.

Figure 7:
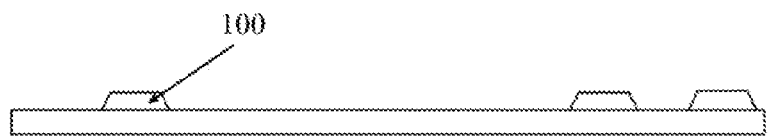
FIG. 7 is a diagram of the display substrate after completing the fabrication of the gate electrode.

Specifically, in step S1, the thin-film transistor is obtained by fabricating, by performing the lithography process repeatedly, a gate electrode 100, a gate insulation layer 101, a active layer 102, a source electrode 103 and a drain electrode 104. The gate electrode 100 after the fabrication is as illustrated in FIG. 7.

Figure 8:
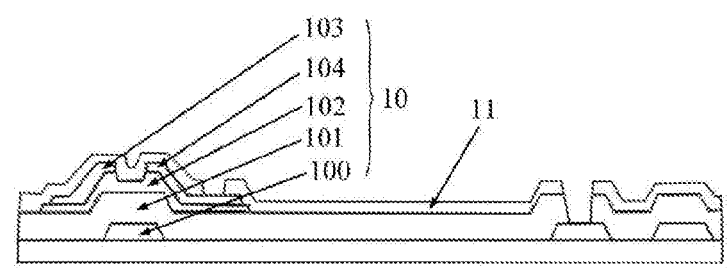
FIG. 8 is a diagram of the display substrate after completing the fabrication of the first insulation layer.

In step S2, a first insulation layer 11 is formed above the thin-film transistor 10, and the display substrate after the fabrication of the first insulation layer 11 is as illustrated in FIG. 8.

Specifically, the material used for forming the first insulation layer 11 in step S2 may be silicon nitride (SiNx) and/or silicon oxide (SiOx).

Figure 9:
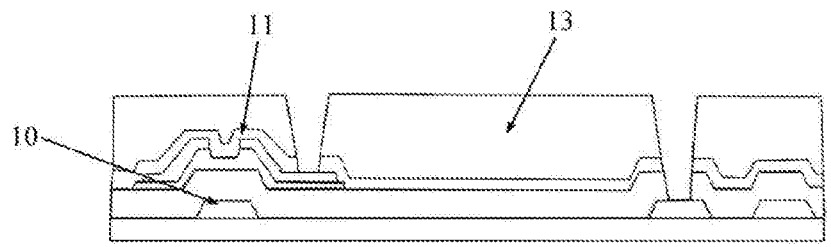
FIG. 9 is a diagram of the display substrate after completing the fabrication of the color filter.

In step S3, the color filter 13 is formed above the first insulation layer 11, and the structure of the display substrate after the fabrication of the color filter 13 is illustrated in FIG. 9.

Specifically, in step S3, a red color filter, a green color filter and a blue color filter may be formed by performing the lithography processes three times. It needs to be noted that, since each of the red, green and blue color filters has a known structure, they are not distinguished in FIG. 9. Also, it should be understood that, since the red, green and blue color filters are not distinguished in FIG. 9, the even surface of the fabricated color filter 13 as shown in FIG. 9 does not reflect the actual surface of the color filter 13 after the fabrication thereof. In fact, the color filter 13 after the fabrication has an uneven surface.

Figure 10:
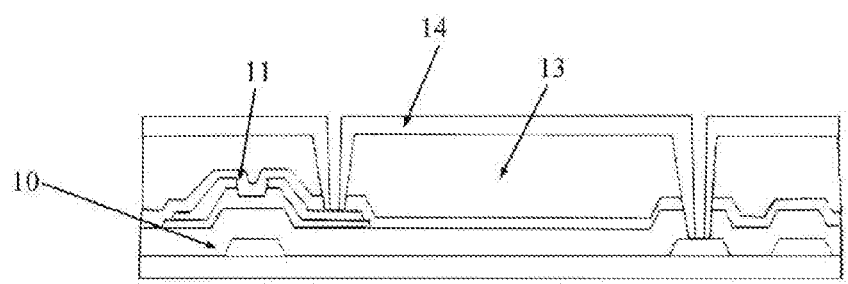
FIG. 10 is a diagram of the display substrate after completing the fabrication of the planarization layer.

In step S4, a planarization layer 14 is formed above the color filter 13, and the structure of the display substrate after the fabrication of the planarization layer 14 is illustrated in FIG. 10.

Since the color filter 13 after the fabrication has an uneven surface, the planarization layer 14 is provided in step S4, such that the display substrate may have an even surface, which facilitates the fabrication of subsequent structures.

Figure 11:
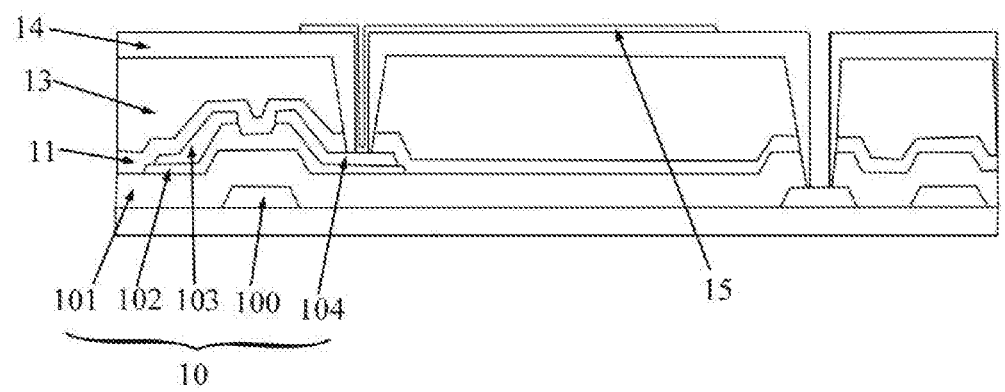
FIG. 11 is a diagram of the display substrate after completing the fabrication of the pixel electrode.

In step S5, a pixel electrode 15 is formed above the planarization layer 14, and the structure of the display substrate after the fabrication of the pixel electrode 15 is illustrated in FIG. 11.

Figure 12:
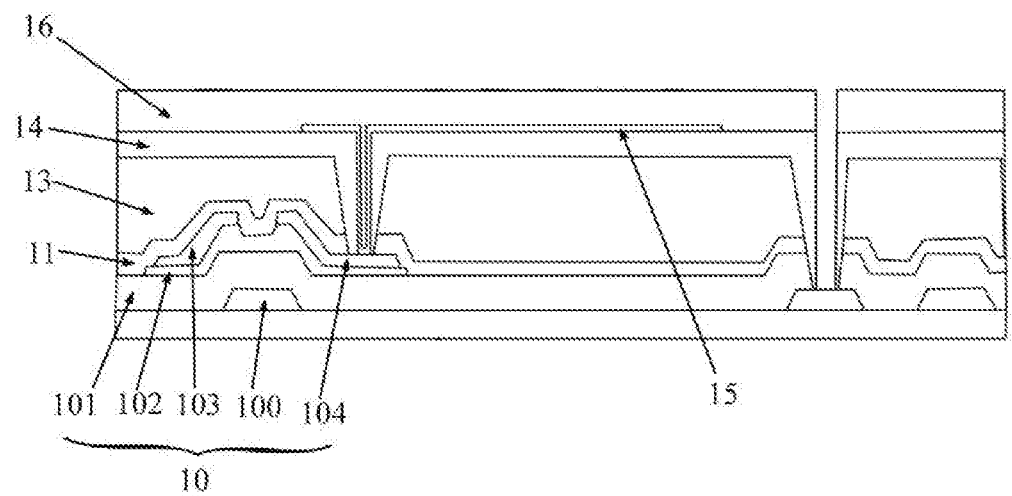
FIG. 12 is a diagram of the display substrate after completing the fabrication of the second insulation layer.

In step S6, a second insulation layer 16 is formed above the pixel electrode 15, and the structure of the display substrate after the fabrication of the second insulation layer 16 is illustrated in FIG. 12.

Specifically, the material for forming the second insulation layer 16 in step S2 may be silicon nitride (SiNx) and/or silicon oxide (SiOx).

Figure 13:
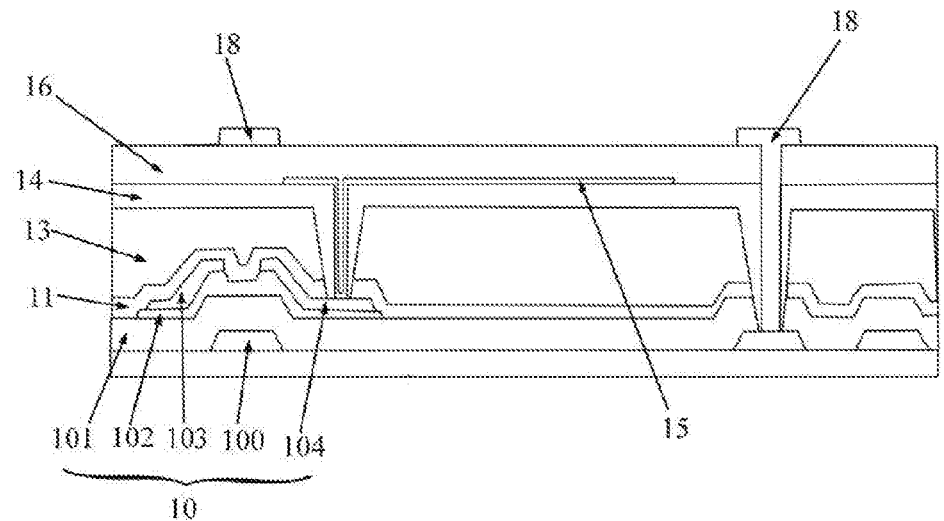
FIG. 13 is a diagram of the display substrate after completing the fabrication of the protection metal layer.

Step S7 is performed after step S6. In step S7, a protection metal layer 18 is fabricated above the second insulation layer 16, and the structure of the display substrate after the fabrication of the protection metal layer 18 is illustrated in FIG. 13. Preferably, the protection metal layer 18 is made of a metal or metal alloy with low reflectivity, thereby reducing the reflection of the ambient light irradiating onto the protection metal layer 18, and reducing the impact on display effect by the reflection on the protection metal layer 18. Specifically, the protection metal layer 18 may be made of at least one of the following metals or metal alloys having low reflectivity: MoNbO, MoNbON, MoTiO, MoTiON and MoSi. The protection metal layer may be fabricated by the lithography process, which includes sequential steps of depositing, coating with photoresist, exposing, developing, etching and removing the photoresist.

Figure 14:
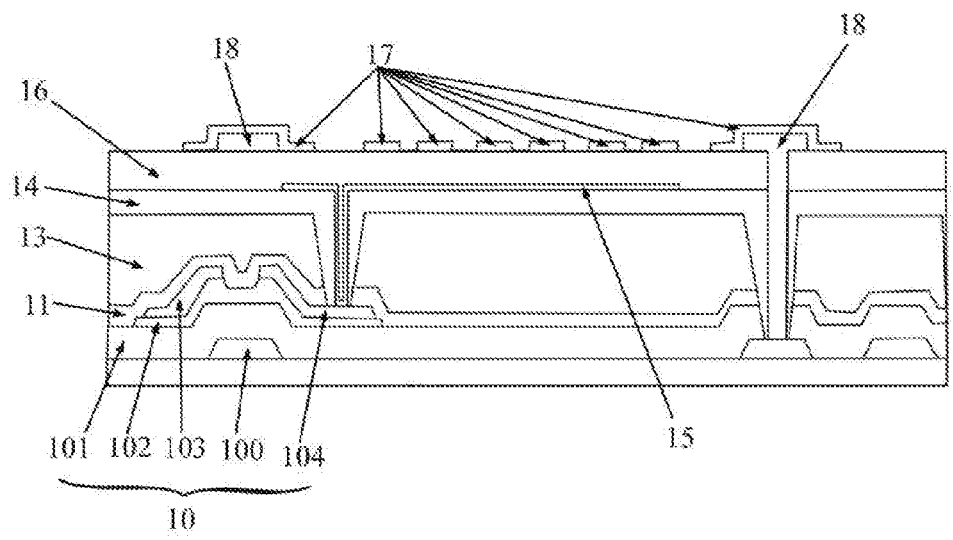
FIG. 14 is a diagram of the display substrate after completing the fabrication of the common electrode.

In step S8, a common electrode 17 is formed above the protection metal layer 18 and the second insulation layer 16, and the structure of the display substrate after the fabrication of the common electrode 17 is illustrated in FIG. 14.

Specifically, in step S8, the common electrode 17 is made of at least one of ITO, ITZO, IGZO and IZO.

According to the above steps S1 to S8, the thin-film transistor 10, the color filter 13, the pixel electrode 15 and the common electrode 17 are fabricated in a display substrate with the use of COA technique, which can increase an aperture ratio, thereby improving brightness and display effect.

In the above embodiment, since the protection metal layer 18 is formed to cover the non-display region of the display substrate so as to function as a black matrix, the above method includes the step of forming the protection metal layer 18, instead of the step of forming the black matrix. As such, it overcomes the problems during the fabrication of the black matrix in the prior art, and thus the stability of structure of the display panel as well as the high resolution of the display panel and excellent display effect thereof can be ensured, and, in the meantime, the procedure of fabrication process is simplified, the manufacture efficiency is improved, and the cost for manufacturing is reduced.

In addition, in the above embodiments, the protection metal layer 18 electrically contacts the common electrode 17, and resistivity of the protection metal layer 18 is less than that of the common electrode 17. It can be understood that, the resistance of the common electrode for signal transmission can be reduced by such an arrangement that the protection metal layer 18 electrically contacts the common electrode 17, which is thereby helpful to maintain consistency of the signal transmitted through the common electrode line and improve display effect.

The present invention further provides an embodiment of a display panel including the above display substrate provided by the above embodiment of the present invention.

According to the display panel provided by the embodiment of the present invention, the above display substrate provided by the above embodiment of the present invention is used and there is no need to fabricate the black matrix in the prior art, and thus the stability of structure of the display panel as well as the high resolution of the display panel and excellent display effect thereof can be ensured, and, in the meantime, the procedure of fabrication process is simplified, the manufacture efficiency is improved, and the cost for manufacturing is reduced.

The present invention also provides an embodiment of a display device including the above display panel provided by the above embodiment of the present invention.

According to the display device provided by the embodiment of the present invention, the above display panel provided by the above embodiment of the present invention is used and there is no need to fabricate the black matrix in the prior art, and thus the stability of structure of the display panel as well as the high resolution of the display panel and excellent display effect thereof can be ensured, and, in the meantime, the procedure of fabrication process is simplified, the manufacture efficiency is improved, and the cost for manufacturing is reduced.

It can be understood that the foregoing embodiments are merely exemplary embodiments used for describing the principle of the present invention, but the present invention is not limited thereto. Those of ordinary skill in the art may make various variations and improvements without departing from the spirit and essence of the present invention, and these variations and improvements shall fall into the protection scope of the present invention.

What is claimed is:

1. A display substrate comprising a plurality of pixels, each of the plurality of pixels has a display region, a non-display region being between the plurality of pixels, wherein the display substrate further comprises a protection metal layer covering the non-display region, a common electrode which electrically contacts the protection metal layer, a base substrate, a thin-film transistor, a color filter, a pixel electrode, a first insulation layer, a second insulation layer and a planarization layer, wherein
the thin-film transistor is disposed on the base substrate and the first insulation layer is disposed above the thin-film transistor;
the color filter is disposed above on the first insulation layer and the planarization layer is disposed above the color filter;
the pixel electrode is disposed above the planarization layer and the second insulation layer is disposed above the pixel electrode; and
the protection metal layer is disposed above the second insulation layer and under the common electrode.

2. The display substrate according to claim 1, wherein the protection metal layer has a reflectivity no more than 20%.

3. The display substrate according to claim 2, the protection metal layer is made of at least one of MoNbO, MoNbON, MoTiO, MoTiON and MoSi.

4. A method for fabricating the display substrate according to claim 3, comprising a step of forming the protection metal layer in the non-display region of the display substrate.

5. A method for fabricating the display substrate according to claim 2, comprising a step of forming the protection metal layer in the non-display region of the display substrate.

6. The display substrate according to claim 1, wherein the common electrode is made of at least one of ITO, ITZO, IGZO and IZO.

7. A method for fabricating the display substrate according to claim 6, comprising a step of forming the protection metal layer in the non-display region of the display substrate.

8. The display substrate according to claim 1, wherein the protection metal layer includes at least one layer, and the layer of the protection metal layer electrically contacting the common electrode has a resistivity less than that of the common electrode.

9. A method for fabricating the display substrate according to claim 8, comprising a step of forming the protection metal layer in the non-display region of the display substrate.

10. A method for fabricating the display substrate according to claim 1, comprising a step of forming the protection metal layer in the non-display region of the display substrate, and further comprising steps of:
forming the thin-film transistor on the base substrate;
forming the first insulation layer above the thin-film transistor;
forming the color filter above the first insulation layer;
forming the planarization layer above the color filter;
forming the pixel electrode above the planarization layer;
forming the second insulation layer above the pixel electrode; and
forming the common electrode above the protection metal layer and the second insulation layer,
wherein the protection metal layer is disposed above a portion of the second insulation layer.

11. The method according to claim 10, wherein the protection metal layer is formed by a lithography process.

12. A display panel including the display substrate according to claim 1.

13. A display device including the display panel according to claim 12.

* * * * *